United States Patent
Roehr (10) Patent No.: US 7,499,349 B2
(45) Date of Patent: Mar. 3, 2009

(54) MEMORY WITH RESISTANCE MEMORY CELL AND EVALUATION CIRCUIT

(75) Inventor: Thomas Roehr, Aschheim (DE)

(73) Assignee: Infineon Technologies AG, Munich (DE)

( * ) Notice: Subject to any disclaimer, the term of this patent is extended or adjusted under 35 U.S.C. 154(b) by 8 days.

(21) Appl. No.: 11/672,343

(22) Filed: Feb. 7, 2007

(65) Prior Publication Data

US 2007/0147102 A1 Jun. 28, 2007

Related U.S. Application Data

(63) Continuation of application No. PCT/EP2005/009813, filed on Sep. 13, 2005.

(30) Foreign Application Priority Data

Sep. 30, 2004 (DE) .................. 10 2004 047 666

(51) Int. Cl.
*G11C 7/00* (2006.01)
(52) U.S. Cl. .................. 365/196; 365/148; 365/163
(58) Field of Classification Search ................ 365/163, 365/148, 189.011, 196
See application file for complete search history.

(56) References Cited

U.S. PATENT DOCUMENTS 6,314,014 B1 11/2001 Lowrey et al.
6,819,619 B2 * 11/2004 Morishita et al. ........... 365/226
2002/0172068 A1 11/2002 Hidaka
2003/0031045 A1 2/2003 Hosotani
2003/0128612 A1 * 7/2003 Moore et al. ................ 365/222
2004/0008556 A1 1/2004 Hidaka

FOREIGN PATENT DOCUMENTS

| EP | 1496518 | 1/2005 |
|---|---|---|
| WO | 02/073620 | 9/2002 |
| WO | 03/088254 | 10/2003 |
| WO | 2004051665 | 6/2004 |

OTHER PUBLICATIONS

PCT International Search Report dated Jan. 17, 2006 for PCT/EP2005/009813.

* cited by examiner

*Primary Examiner*—Richard Elms
*Assistant Examiner*—Han Yang
(74) *Attorney, Agent, or Firm*—Dicke, Billig & Czaja, PLLC (57) ABSTRACT

A memory circuit comprising a memory cell which has a resistance memory element and is connected between a ground terminal and a capacitor has a reference memory cell with a reference resistor which is connected between the ground terminal and a reference capacitor, in which case, during the reading operation of the memory cell, the memory cell and the reference memory cell are switched on in order to charge or discharge the capacitor and the reference capacitor, and an evaluation device evaluates the difference between the electrical potentials of the capacitor and the reference capacitor at a predetermined instant after the switching-on of the memory cell and the reference memory cell.

11 Claims, 7 Drawing Sheets

MEMORY WITH RESISTANCE MEMORY CELL AND EVALUATION CIRCUIT

CROSS-REFERENCE TO RELATED APPLICATION

This application is a continuation of co-pending PCT patent application No. PCT/EP2005/009813, filed 13 Sep. 2005, which claims the benefit of German patent application serial number DE 10 2004 047 666.7-55, filed 30 Sep. 2004. Each of the aforementioned related patent applications is herein incorporated by reference in its entirety.

BACKGROUND OF THE INVENTION

1. Field of the Invention

The invention relates to a memory circuit comprising memory cells having a resistance memory element, and an evaluation circuit for reading out the memory content of such memory cells. In this case, the resistance memory element can be switched back and forth between a high-resistance state and a low-resistance state by means of electrical pulses.

2. Description of the Related Art

The development of semiconductor memory technology is essentially driven by the requirement for increasing the performance of the semiconductor memories in conjunction with miniaturization of the feature sizes. However, further miniaturization of the semiconductor memory concepts based on storage capacitors is difficult in particular owing to the large quantities of charge that are required for writing to and reading from the storage capacitors and lead to a high current demand. Therefore, thought is increasingly being given to new cell concepts that are distinguished by a significantly lower quantity of charge for the writing and reading operation. Semiconductor memories comprising a resistance memory element are one such promising circuit architecture.

One possible memory concept comprising a resistance memory element is the so-called CBRAM (conductive bridging RAM) cell, in which the resistance memory element comprises an inert cathode electrode, a reactive anode electrode and a porous, highly resistive ionically conductive carrier material in between. Through application of electric fields between the two electrodes, it is possible to produce a conductive path through the carrier material and to clear it away again. Depending on the polarity of the electrical pulses applied between anode electrode and cathode electrode, the reactive anode electrode is dissolved electrochemically and, by means of the metal ions released, an electrically conductive connection between the electrodes is produced or this conductive connection is interrupted again, the metal ions in the carrier material depositing on the anode electrode. CBRAM memory cells can be switched back and forth between a high-resistance state and a low-resistance state, the different resistance values each being assigned a logic state.

In addition to CBRAM memory cells, further resistive memory cell concepts are currently being investigated, such as the phase change memory (PCRAM), for example, in which a metal alloy is heated by means of electrical pulses and switched back and forth between an amorphous phase state and a crystalline phase state in the process. The two states are distinguished by a great difference in their conductivity, which can be utilized for the electrical read-out of the memory cell. A further resistive memory concept is the perovskite memory cell, in which, in a perovskite layer, a structure transition between a high-resistance state and a low-resistance state is produced by means of charge injection. Amorphous silicon continues to be used as carrier material in a resistance memory element of a resistive memory cell; said amorphous silicon, after a forming step, can be switched back and forth between a high-resistance state and a low-resistance state by means of electrical pulses. Consideration is also being given to memory concepts having a polymer layer or an organic storage layer in which states having different conductivities can be produced in the carrier layer on the basis of charge transfer complexes that are influenced by electrical pulses.

During the read-out of a resistance memory element, generally the procedure is such that a capacitor is charged or discharged via the resistance memory element and the electrical potential of the capacitor is then evaluated after a predetermined instant in order thus to determine the logic state of the memory cell comprising the resistance memory element. In this case, the electrical potential of the capacitor or discharged via the resistance memory element is preferably compared with a reference potential and the potential difference is determined.

On account of the relatively small voltage swing which results during the charging or discharging of a capacitor via a memory cell comprising a resistance memory element and which lies in the range of 100 mV to 200 mV e.g. in the case of CBRAM cells, it is necessary, for reliable evaluation of the electrical potential of the capacitor charged or discharged via the resistance element, to set the reference voltage for evaluating the difference between the potentials as exactly as possible between the read voltage for the state "0" and the state "1" of the resistance memory cell. Such precise reference voltage setting can be achieved in principle by means of a voltage regulator. It is advantageous, however, to implement the reference voltage for evaluating the charge state of memory elements with the aid of precisely such memory elements, since this affords the possibility of largely compensating for manufacturing fluctuations or fluctuations in the operating conditions in the memory.

In the case of memory concepts based on the magnetotunnel effect (MRAM) reference voltage generation is known in which two additional memory elements, in the case of which one memory element is set to the state "0" and the other is set to the state "1", are connected in parallel with one another and the average resistance of these two memory cells is used for generating the reference potential. Such reference voltage generation, as is known from WO 2004/051665 A1, presupposes, however, that the difference between the resistance values of the memory elements for the state "0" and the state "1" amounts to only a few 10%. Averaging of the resistance values for the state "0" and the state "1" generally cannot be used for forming a reference voltage in resistance memory elements, however, since, in resistance memory elements, a large change in resistance usually occurs between the state "0" and the state "1". This holds true for CBRAM cells, for example, in which the state "0" defined by a carrier material layer without a conductive path has a resistance of $10^{10}\Omega$, whereas the state "1" defined by a carrier material layer with a conductive path has a resistance of $10^4\Omega$. On account of the six orders of magnitude smaller resistance value of the CBRAM cell in the state "1", upon averaging the resistance values for the state "0" and for the state "1", the average value would practically correspond to the resistance value for the state "1". As a consequence, the reference voltage generated with such an average resistance value would then essentially be the read voltage for the state "1" of the CBRAM cell.

SUMMARY OF THE INVENTION

One embodiment of the present invention provides an improved switching arrangement for generating a reference voltage for evaluating read signals of a memory cell comprising a resistance memory element.

According to the invention, for the read-out of a memory cell comprising a resistance memory element connected between a ground terminal and a capacitor, an evaluation device assessing the difference between the electrical potentials of the capacitor and a reference capacitor, a reference memory cell with a reference resistor is connected between the ground terminal and the reference capacitor, the memory cell and the reference memory cell being switched on during the reading operation in order to charge the capacitor and the reference capacitor to a read voltage or in order to discharge the capacitor and the reference capacitor which have been precharged to the read voltage, and the evaluation device assessing the difference between the electrical potentials of the capacitor and the reference capacitor at a predetermined instant after the switching-on of the memory cell and the reference memory cell.

According to the invention, the reference potential for the read-out of a memory cell comprising a resistance memory element is generated in accordance with the same principle, namely by means of charging or discharging a reference capacitor via a reference resistor, which also forms the basis for the reading of the memory cell itself. Such a reference potential concept makes it possible to reliably compensate for manufacturing fluctuations or fluctuations in the operating conditions. Furthermore, an additional circuit for generating the reference voltage can be dispensed with. In this case, the reference memory cell may be designed such that during the charging or discharging operation, at the evaluation instant, the reference voltage lies precisely between the voltages which represent the state "0" and the state "1" of the memory cell comprising the resistance memory element.

Such a setting of the reference resistor can preferably be achieved by means of a series circuit of reference memory cells comprising a resistance memory element, the resistance memory element corresponding to that of the regular memory cells. If, by way of example, an evaluation of the memory cell is intended to be performed after a read time when a charging or discharging of the capacitor via the resistance memory element of the memory cell of 78% has taken place, the reference resistor for charging or discharging the reference capacitor preferably has triple the resistance of the resistance memory element, that is to say that preferably three resistance memory elements are connected in series for forming the reference memory cell. In the case of a charging or discharging of the capacitor via the memory cell of 91%, the reference resistor preferably corresponds to quadruple the resistance of the resistance memory element, that is to say that preferably four resistance memory elements are connected in series for forming the reference memory cell. Preferably, however, an evaluation of the capacitor charged or discharged via the resistance memory element of the memory cell is performed after a read time corresponding to a degree of charging or discharging of 96%, the reference resistor then preferably having five times the resistance of the resistance memory element. An evaluation of the memory cell in the case of 96% charging or discharging provides for a sufficient signal strength and thus for a reliable read-out operation and simultaneously for a sufficiently short read time.

In accordance with a further preferred embodiment, the series circuit of reference memory cells that forms the reference resistor has a selection transistor connected upstream, the channel length of which preferably essentially corresponds to the channel length of the selection transistors of the memory cells multiplied by the number of resistance memory elements connected in series. This design of the reference resistor reliably ensures that the resistance value for generating the reference voltage is set exactly to a desired value between the read voltage for the state "0" and the state "1" of the memory cell comprising the resistance memory element, since account is additionally taken of the resistance of the selection transistor for the switching of the reference memory cell. The design of the reference memory cell having a series circuit of resistance memory elements with a single selection transistor having an increased channel length enables simplified production, since only one selection transistor then has to be fabricated.

In accordance with a further preferred embodiment, the capacitor and the reference capacitor are formed by a line pair comprising a bit line and a complementary bit line. For the read-out of the memory cell comprising the resistance memory element, it is thus possible to use the known DRAM memory cell construction in which a memory cell read-out operation is performed with the aid of a differential sense amplifier as evaluation circuit, which is connected to the bit line and a complementary bit line. The bit line and the complementary bit line then form with their parasitic line capacitances together with the connected resistance memory elements the RC constants which set the read voltage or reference voltage value during the read-out of the memory cell.

Furthermore, in this case preference is given to a switching construction in which a multiplicity of memory cells and in each case a reference resistor are connected to the bit line and to the complementary bit line in parallel in each case, and when a memory cell connected to the bit line is switched on, the reference resistor on the complementary bit line is additionally switched on, and when a memory cell additionally connected to the complementary bit line is switched on, the reference resistor on the bit line is additionally switched on. This circuit concept enables a space-saving construction of a memory cell matrix in conjunction with a simple and reliable evaluation operation.

In accordance with a further preferred embodiment, a programming circuit is provided in order to activate the resistance memory elements of the series circuit of reference memory cells that forms the reference resistor. This makes it possible to set an ideal reference resistance for the respective memory cell layout in a simple manner.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 shows signal profiles in the case of a memory circuit according to the invention, FIG. 3A showing the signals on the bit lines of the circuits shown in FIG. 2 during a read operation, FIG. 3B showing the relative signal strength in relation to the ratio of reference resistance to resistance of the resistance memory element, and FIG. 3C showing discharge curves for the bit line via the memory element and the complementary bit line via the reference memory cell;

FIG. 5 shows a programming circuit according to the invention for activating the individual reference memory cells in a series circuit, FIG. 5A showing the circuit construction with a truth table, FIG. 5B showing the writing to a reference memory cell in the series circuit, FIG. 5C showing the readout of the series circuit of reference memory cells.

DETAILED DESCRIPTION OF THE PREFERRED EMBODIMENT

Figure 1:
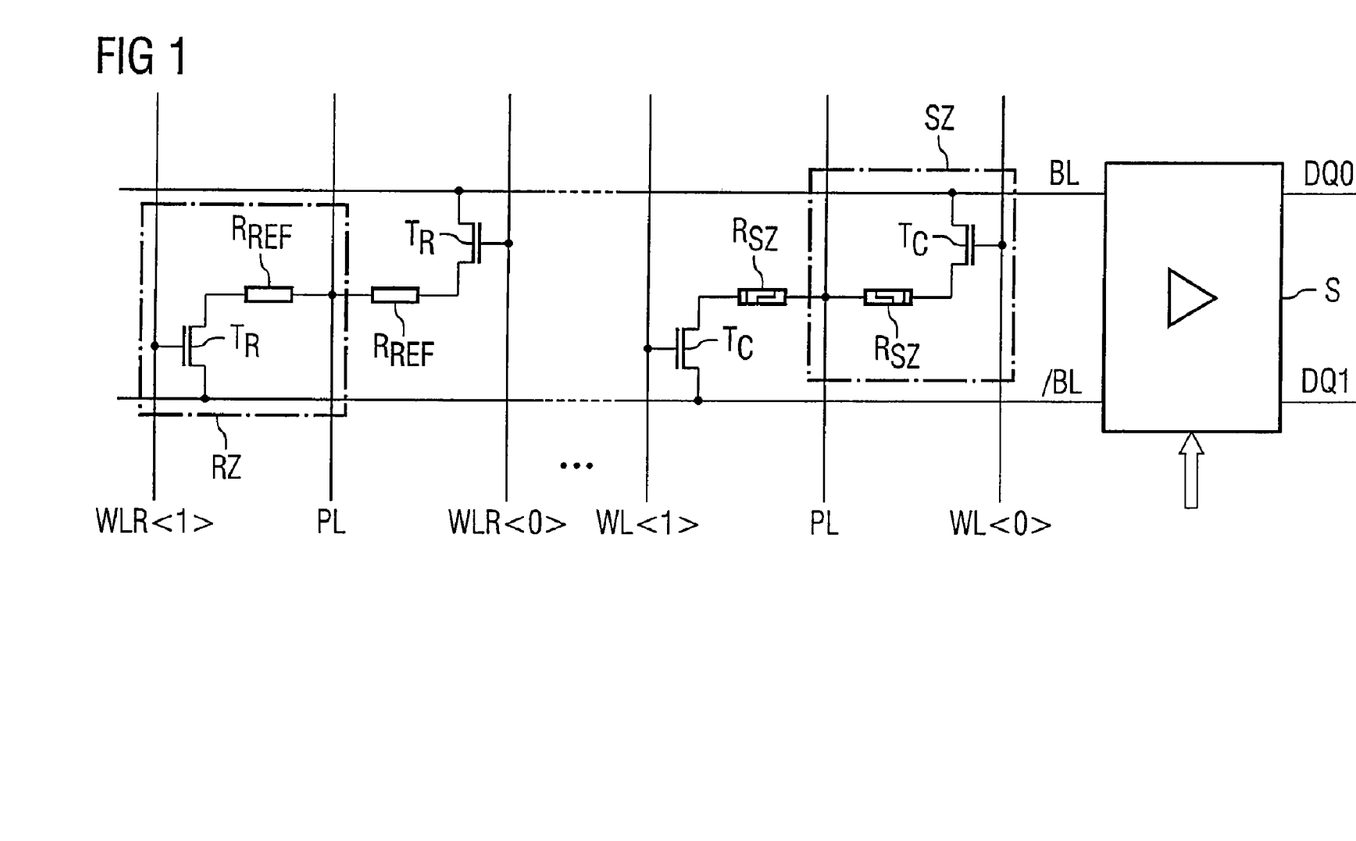
FIG. 1 schematically shows a memory circuit according to the invention with a bit line pair architecture.

FIG. 1 schematically shows a detail from a data memory comprising a memory circuit according to the invention. In this case, the memory is preferably formed in matrix-type fashion with column-type word lines and row-type bit lines, the individual memory cells being arranged at the crossover points between word and bit lines. FIG. 1 in this case shows a bit line pair, comprising a bit line BL and a complementary bit line /BL, which are crossed by word lines WL. A multiplicity of memory cells SZ (only two are shown) and two reference memory cells RZ are alternately connected at the crossover points between the bit line BL and the complementary bit line /BL of the bit line pair with the word lines.

The bit line BL and the complementary bit line /BL are furthermore connected to a differential sense amplifier SA, which compares the electrical potentials on the bit line BL and the complementary bit line /BL with one another and, depending on the resulting potential difference, amplifies the two electrical potentials to two predetermined potential values. In this case, the higher potential on the bit line pair is generally pulled to the potential of the supply voltage of the memory, and the low potential is generally pulled to the ground potential, by the differential sense amplifier SA. The amplified signals are then output onto a local bus DQ0, DQ1, by the differential sense amplifier SA. The differential sense amplifier SA furthermore has a signal input S, by means of which the differential sense amplifier is driven for the readout of the memory cells by a control unit (not shown) of the memory.

Each memory cell SZ is composed of a drive transistor $T_C$ and a resistance memory element $R_{SZ}$, which are connected between the bit line BL or respectively the complementary bit line /BL and a ground line PL. In this case, the resistance memory element $R_{SZ}$ is preferably a resistance memory element that is also known as a PMC (programmable metallization cell) and comprises a reactive anode electrode and an inert cathode electrode, between which a storage layer made of a porous, highly resistive ionically conductive solid electrolyte is provided. Through application of a positive voltage between the reactive anode electrode and the inert cathode electrode, the reactive anode electrode is dissolved electrochemically and metal-rich deposits in the solid electrolyte are intensified, so that a conductive path between the anode electrode and the cathode electrode forms through the solid electrolyte. Said conductive path can be cleared away again through application of a negative voltage between the anode electrode and the cathode electrode, the ions released into the electrolyte from the anode electrode depositing on the anode electrode again. The PMC resistance memory cell can thus be switched back and forth between a high-resistance state and a low-resistance state by means of electrical pulses applied alternately between anode electrode and cathode electrode.

Suitable solid electrolytes for use in PMC resistance memory elements are primarily chalcogenide compounds with elements of the sixth main group such as selenium, sulfur, tellurium, and in this case, in particular, compounds with semiconductor properties which can easily be processed together with silicon in the context of memory cell production. Silver or copper, by way of example, can be used as a reactive anode electrode which releases metal ions into the electrolyte material as a result of electrical pulses.

In addition to such PMC resistance memory elements, it is also possible to use other resistance memory elements which are based on the principle that the conductivity of a storage layer arranged between an anode electrode and cathode electrode can be changed by means of electrical pulses, that is to say that the storage layer switches over between a low-resistance state and a high-resistance state. Thus, in the case of a resistance memory element, a polymer in the case of which charge transfer complexes can be formed as a result of electrical pulses may be used e.g. as a storage layer. Furthermore, resistance memory element concepts to which consideration is given include phase change memories, in the case of which a metal alloy, e.g. a chalcogenide alloy, is switched between an amorphous state and a crystalline state by means of electrical pulses. In this case, the two states have great differences in their conductivity. A further resistance memory cell concept is a perovskite cell, in the case of which a perovskite layer is provided between the electrodes, in the case of which application of a voltage between the electrodes results in a charge carrier injection which provides for a structure transition between a high-resistance state and a low-resistance state. Furthermore, there is the possibility of using amorphous silicon as carrier material between the electrodes in the case of a resistance memory element; said amorphous silicon can be switched between a high-resistance state and a low-resistance state by means of electrical pulses. This concept is also known as an Si:H memory cell concept.

The drive transistor $T_C$ of the memory cell SZ comprising the resistance memory element $R_{SZ}$ is preferably a field effect transistor via which the resistance memory element is connected to the associated bit line BL or complementary bit line /BL. In this case, the drive transistors $T_C$ of the memory cells SZ are switched on and off via the assigned word lines WL connected to the gate contacts of the transistors.

In the case of the memory circuit shown in FIG. 1, the memory cells SZ (two shown) driven via the word lines WL are alternately connected to the bit line BL and the complementary bit line /BL. A memory having such a memory circuit is generally constructed in square fashion and in this case comprises a multiplicity of word lines, e.g. 1024, and a corresponding number of bit lines and complementary bit lines, respectively. In such a case, 512 memory cells are then in each case connected to the bit line BL and the assigned complementary bit line /BL of the bit line pair between the bit line or respectively complementary bit line and the ground line PL.

Each bit line BL or complementary bit line /BL is furthermore connected to a reference memory cell RZ connected between the bit line BL or complementary bit line /BL and the ground line PL, a drive transistor $T_R$ of the reference memory cells RZ connected to the bit line BL being driven on a first reference word line WLR<0> and a drive transistor $T_R$ of the reference memory cells RZ connected to the complementary bit line /BL being driven via a second reference word line WLR<1>.

The charge state of a memory cell SZ, that is to say the charge state of the associated resistance memory element RSZ, is read out by charging or discharging a capacitor via the resistance memory element. The capacitance of the bit line BL or complementary bit line /BL is used as the capacitor. In this case, the read-out operation is effected in such a way that the drive transistor Tc of the memory cell SZ is switched on via the associated word line WL, so that, via the resistance memory element RSZ, a charging or discharging operation is effected between the bit line BL or complementary bit line /BL to which the memory cell is connected and the ground line PL. The electrical potential on the bit line BL or complementary bit line /BL is then determined at a predetermined instant by the differential sense amplifier SA connected to the bit line and complementary bit line /BL.

In order to be able to carry out a reliable evaluation of the electrical potential on the bit line BL or complementary bit line /BL, the evaluation is carried out by the differential sense amplifier SA with respect to a reference potential. Said reference potential is supplied by the further bit line or complementary bit line of the bit line pair which is connected to the differential sense amplifier SA. In this case, the reference potential is generated according to the same principle as the read-out potential of the memory cell, namely by charging or discharging a capacitor via the reference memory cell RZ connected to the bit line or complementary bit line. In this case, the reference capacitor used is in turn preferably the parasitic capacitance of the bit line or complementary bit line which is charged or discharged via the reference resistor of the reference memory cell.

The read-out operation of a memory cell is then effected such that if the drive transistor $T_c$ of the memory cell SZ connected to the bit line of a bit line pair is switched on via the associated word line WL, at the same time the drive transistor $T_R$ of the reference memory cell RZ connected to the complementary bit line is also switched on via the associated reference word line WLR. If, by contrast, the memory cell SZ on the complementary bit line /BL is switched on via the corresponding drive transistor $T_c$ via the associated word line WL for read-out, then at the same time the reference memory cell RZ is activated with the aid of the drive transistor $T_R$ via the associated reference word line WLR connected to the bit line BL. The differential sense amplifier SA connected to the bit line and the complementary bit line then detects the electrical potentials on the bit line and complementary bit line at a predetermined instant after the switching-on of the memory cell or reference memory cell, assesses the difference between these electrical potentials and amplifies the potential difference to a predetermined value. The amplified signals are subsequently output by the differential sense amplifier SA onto the connected bus lines DQ0, DQ1 for further processing.

By virtue of the fact that the reference voltage is generated by means of the reference memory cells according to the same principle as the read-out of the memory cell itself, fluctuations in the parameters of the memory cells or the resistance memory elements of the memory cells which are brought about by the production or operating conditions can be effectively compensated for. Furthermore, there is no need for a special voltage generator circuit for generating the reference potential, so that an additional complicated circuit can be dispensed with.

Figure 2:
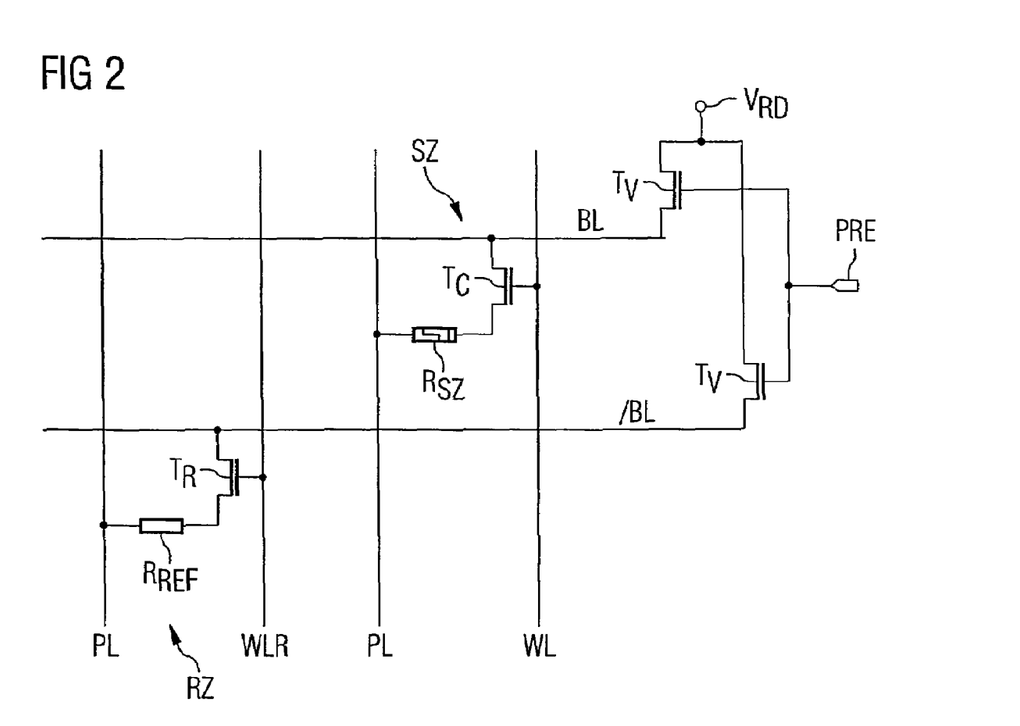
FIG. 2 schematically shows the circuit shown in FIG. 1 with a precharge circuit.

FIG. 2 shows a read-out of the memory elements by discharging the capacitance of the bit line or the complementary bit line. For this purpose, the bit line BL and the complementary bit line /BL are connected to a read voltage generator $V_{RD}$ via interposed selection transistors $T_v$ by corresponding driving PRE. This precharge circuit may be integrated into the differential sense amplifier SA. In this case, the read-out of a memory cell is effected according to the signal scheme shown in FIG. 3. After the decoding of the address of the bit line pair comprising bit line and complementary bit line on which the memory cell SZ to be read is arranged, through application of a precharge signal PRE to the gate contacts of the selection transistors $T_v$ of the precharge circuit of the bit line pair, the selection transistors are activated and the read voltage $V_{RD}$ is applied to bit line BL and the complementary bit line /BL. If a column-by-column read-out of the memory cells in the memory is intended, there is also the possibility of simultaneously charging all the bit lines or complementary bit lines by activating the selection transistors of all the precharge circuits.

In this case, the precharge signal PRE is applied to the selection transistors $T_v$ until the bit line and the complementary bit line have been charged completely to the read voltage, for approximately 2 nsec in the embodiment shown. The selection transistors $T_v$ of the precharge circuit are then turned off. In parallel with the switching-off of the precharge signal PRE and thus of the selection transistors $T_v$ of the precharge circuit, the desired memory cell column is switched on with the aid of the associated selection transistors according to the decoded word line address via the corresponding word line WL. In the embodiment shown in FIG. 2, the memory cells SZ connected to the bit line BL are activated in this case. In parallel with this, via the reference word lines WLR, depending on whether the activated memory cell column is connected to the bit line or complementary bit line of the bit line pair, via the reference word line the drive transistors $T_R$ of the reference memory cell column which is connected to the second line of the bit line pair are switched on, that is to say the reference memory cells connected to the complementary bit line in the embodiment shown in FIG. 2.

As a result of the activation of the drive transistors of the memory cell and the reference memory cell, the bit line pair comprising bit line and complementary bit line that was precharged to the read voltage is discharged via the memory cell and reference memory cell, respectively. If the resistance memory element $R_{SZ}$ of the activated memory cell SZ is in the high-resistance state in this case, e.g. has a resistance in the region of $10^{10}\Omega$ in the case of a CBRAM memory cell, practically no discharge of the bit line via the memory cell takes place within the predetermined short read time −10 nsec in the example in accordance with FIG. 3A. The voltage value on the bit line is still the precharged read voltage. In this case, the high-resistance memory cell represents the logic state "1". If, by contrast, the resistance memory element $R_{SZ}$ of the memory cell SZ is in the low-resistance state, then the capacitance of the bit line is practically discharged to the voltage value of the ground line PL. A CBRAM memory cell has a resistance of $10^4\Omega$ in the low-resistance state, when a conductive path is formed through the resistance memory element. The low-resistance memory cell represents the logic state "0".

Figure 3A:
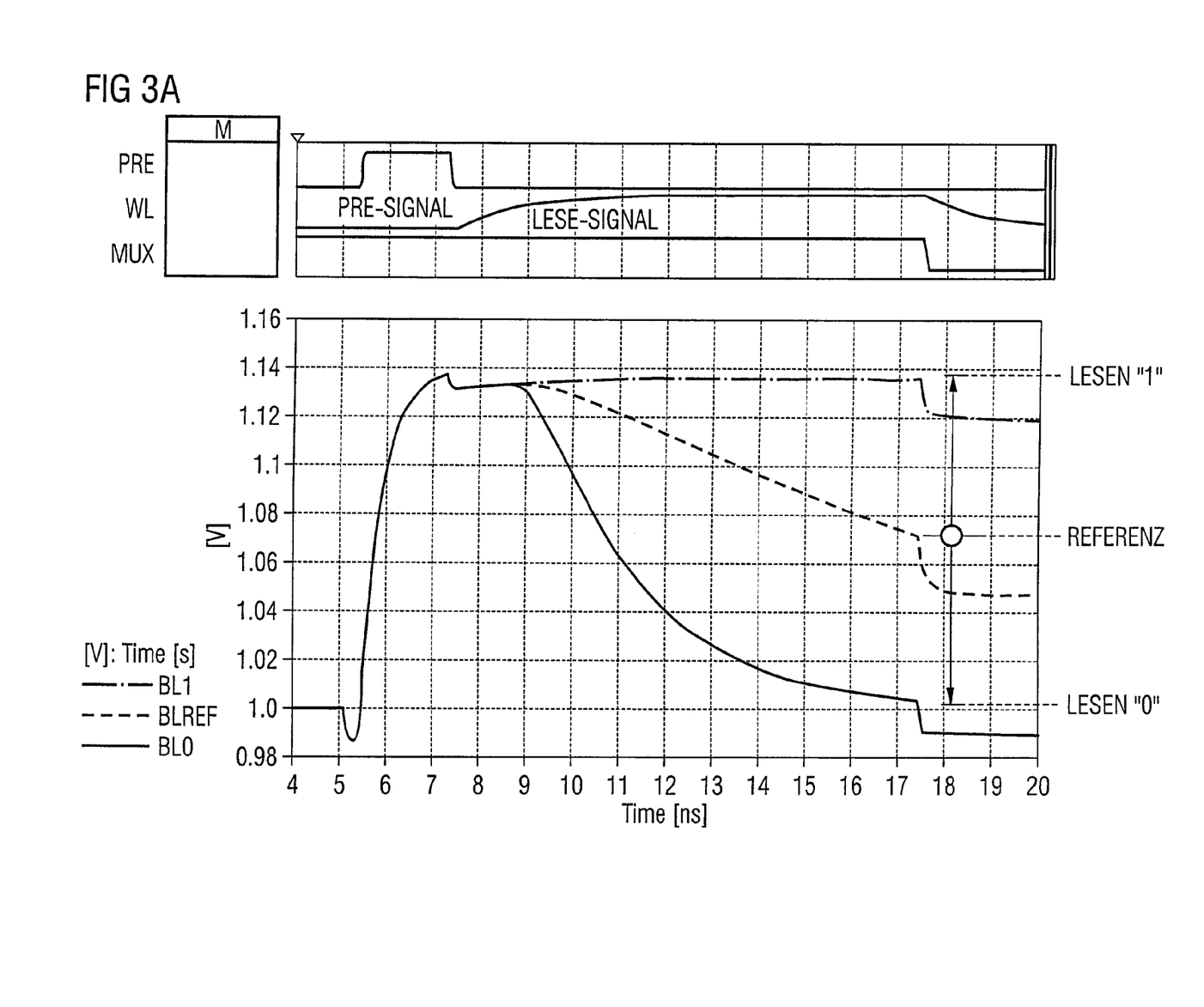

The differential sense amplifier SA evaluates the voltage state on the bit line BL after the discharge via the memory element after the predetermined read time, here 10 nsec, after the switching-on of the drive transistor $T_c$ of the memory cell SZ via the associated word line WL. In this case, the voltage state of the bit line is compared with the reference voltage on the complementary bit line of the bit line pair which is discharged via the reference memory cell. In this case, the reference voltage is defined by the resistance of the reference memory cell, to be precise preferably such that the reference voltage value lies precisely between the voltage values of the bit line for the states "0" and "1" of the memory cell, as is shown in FIG. 3A.

The ideal resistance of the reference memory cell RZ can be determined as follows. For the voltage $V_{READ}$ on the bit line BL which is discharged via the memory cell SZ, and the voltage $V_{REF}$ on the complementary bit line /BL which is discharged via the reference memory cell RZ, the following capacitor equations result after the read time t:

$$V_{READ} = V_{RD} \cdot \exp\left(-\frac{t}{R_{ON} \cdot C_{BL}}\right) = V_{RD} \cdot F \quad (1)$$

$$V_{REF} = V_{RD} \cdot \exp\left(-\frac{t}{R_{REF} \cdot C_{BL}}\right) = V_{RD} \cdot F'$$

In this case, $C_{BL}$ is the capacitance of the bit line or complementary bit line and $R_{ON}$ is the resistance of the memory cell in the low-resistance state, and $R_{REF}$ is the resistance of the reference memory cell.

The voltage on the bit line and complementary bit line is equal to the read voltage $V_{RD}$ at the beginning of the discharging operation and then approaches the voltage zero asymptotically at different rates. After the read time t, the discharge state F has been reached for the bit line which is discharged via the memory cell and the discharge state F' has been reached for the complementary bit line which is discharged via the reference memory cell.

In the case of memory cells comprising resistance memory elements, as explained practically no voltage drop has occurred after the read time t on account of the very large resistance of the resistance memory element in the logic state "1". Therefore, the read voltage $V_{RD}$ is still completely present on the bit line BL. In the low-resistance state of the memory cell comprising the resistance memory element, by contrast, which represents the logic state "0", the bit line is discharged to the value $V_{RD}$·F via the memory cell. The following then holds true for the reference voltage $V_{REF}$ which is intended to lie precisely between the two read voltages $V_{RD}$ and $V_{RD}$·F:

$$F' = \frac{F+1}{2} \quad (2)$$

$$F' = \exp\left(-\frac{t}{R_{REF} \cdot C_{BL}}\right) \quad (3)$$

The following results from this for the reference resistance $V_{REF}$ taking account of the capacitor equation according to (1)

$$R_{REF} = R_{ON} \cdot \frac{\ln F}{\ln(F+1) - \ln 2} \quad (4)$$

Figure 3B:
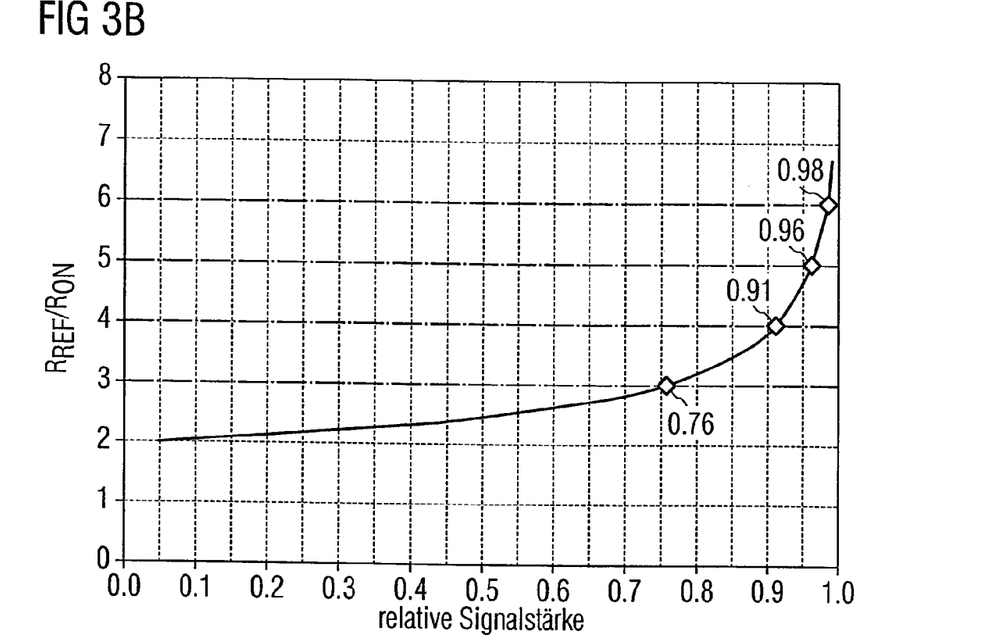

The relationship between the ideal reference resistance of the reference memory cell and the resistance of the resistance memory element of the memory cell in the low-resistance state is illustrated graphically in FIG. 3B for different degrees of discharging and thus relative signal ratios. It is preferred for the reference memory cell to be formed as a series circuit of resistance memory elements which are also provided for the regular memory cells. FIG. 3B then also highlights the integer values of the ratio of reference resistance to resistance of the resistance memory element of the memory cell. For a degree of discharging of 76%, an ideal reference resistance of 3×$R_{ON}$ results in order to achieve an average reference voltage between the voltage for the logic state "0" and the logic state "1" of the memory cell. Given a degree of discharging of 91%, the reference resistance is preferably 4×$R_{ON}$. An absolutely reliable evaluation of the logic state of the memory cell can be ensured given a degree of discharging of 96%. An ideal reference resistance of 5×$R_{ON}$ would have to be chosen for such a read signal.

Figure 3C:
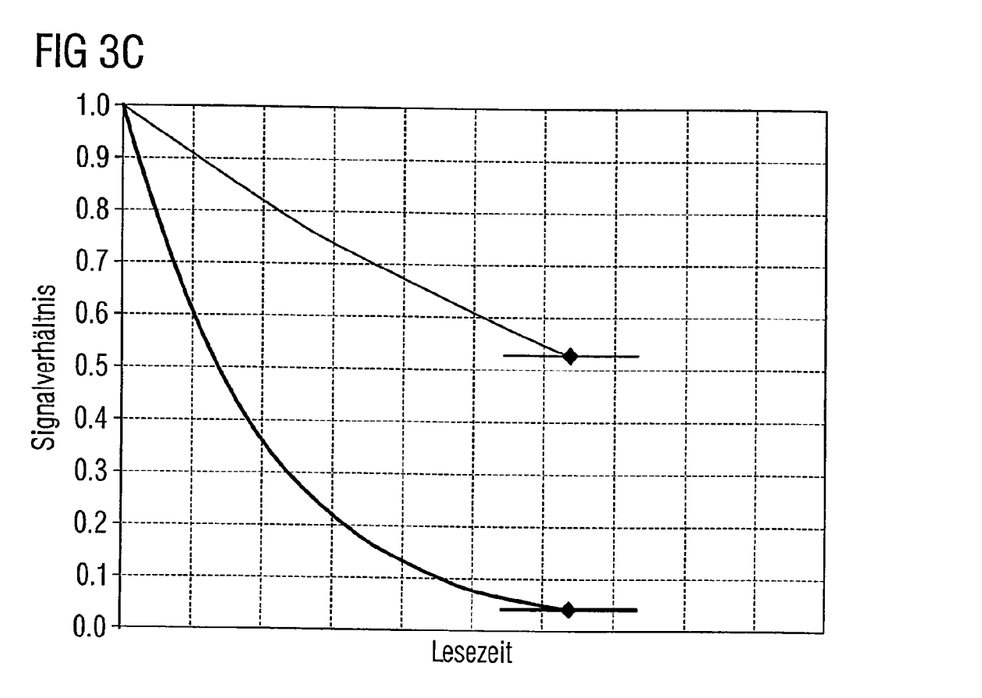

FIG. 3C shows the corresponding discharge curves for an ideal reference resistance given a degree of discharging of the bit line via the memory cell of 96%. A degree of discharging of 48%, that is to say precisely half of the signal of the memory cell, is then achieved via the reference memory cell given a five-fold resistance relative to the resistance of the resistance memory element of the memory cell.

Figure 4:
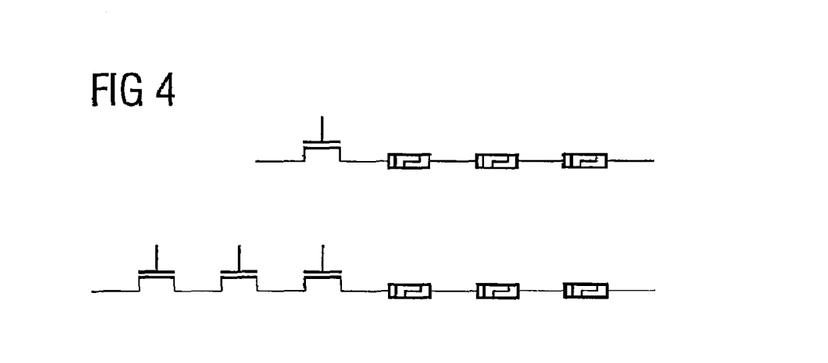
FIG. 4 shows two reference resistor configurations with a respective series circuit of reference memory cells.

FIG. 4 shows the possible construction of the reference memory cell made from discrete memory cells. The example shows a series circuit of three memory cells for forming the reference memory cells. In order not to disregard the resistance of the drive transistor of the memory cell in this case, there is the possibility, as shown in FIG. 4, of connecting three resistance memory elements and three selection transistors in series. As an alternative, however, it is also possible to use only one selection transistor having triple channel length, as is furthermore shown in FIG. 4, which selection transistor is then connected in series with three resistance memory elements.

Figure 5A:
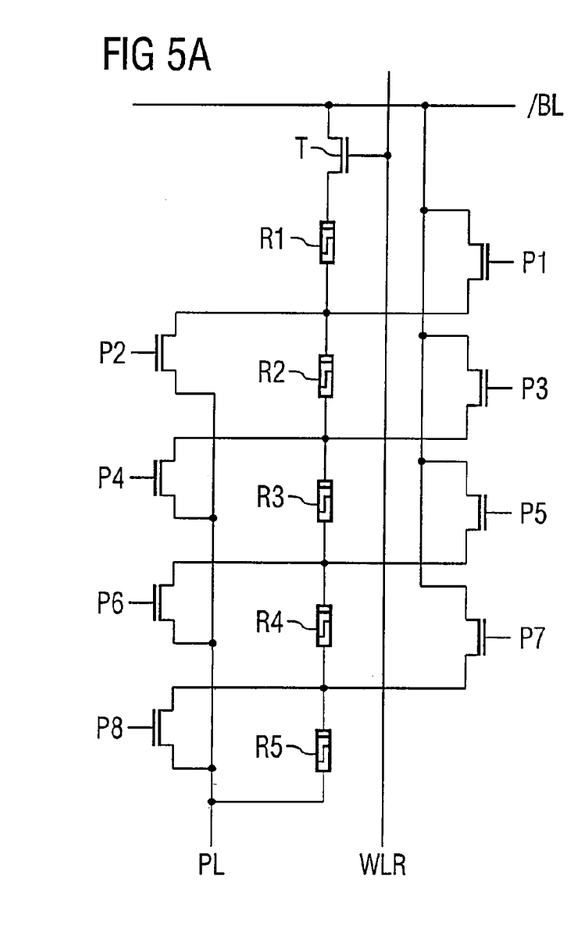

If discrete memory cells comprising resistance memory elements are used for forming the reference memory cell, it is necessary, after the production of the reference memory cell, to program the latter to the ideal reference resistance. This can be carried out by means of a circuit as illustrated in FIG. 5A. A reference memory cell comprising five series-connected resistance memory elements R1-R5 and a drive transistor T connected upstream is illustrated as an example here. In this case, the programming may be effected via the bit line or complementary bit line (as shown in FIG. 5A) and the ground line PL between which the reference memory cell is connected. For this purpose, in accordance with FIG. 5A, a network of drive transistors P1-P8 is provided in parallel with the resistance memory elements between the complementary bit line /BL and ground line PL. The programming circuit is constructed in such a way that a drive transistor P1, P3, P5, P7 is respectively connected in parallel with the first four resistance memory elements R1, R2, R3, R4 proceeding from the complementary bit line and a drive transistor P2, P4, P6, P8 is respectively connected in parallel with the last four resistance memory elements R2, R3, R4, R5 proceeding from the ground line PL.

Figure 5B:
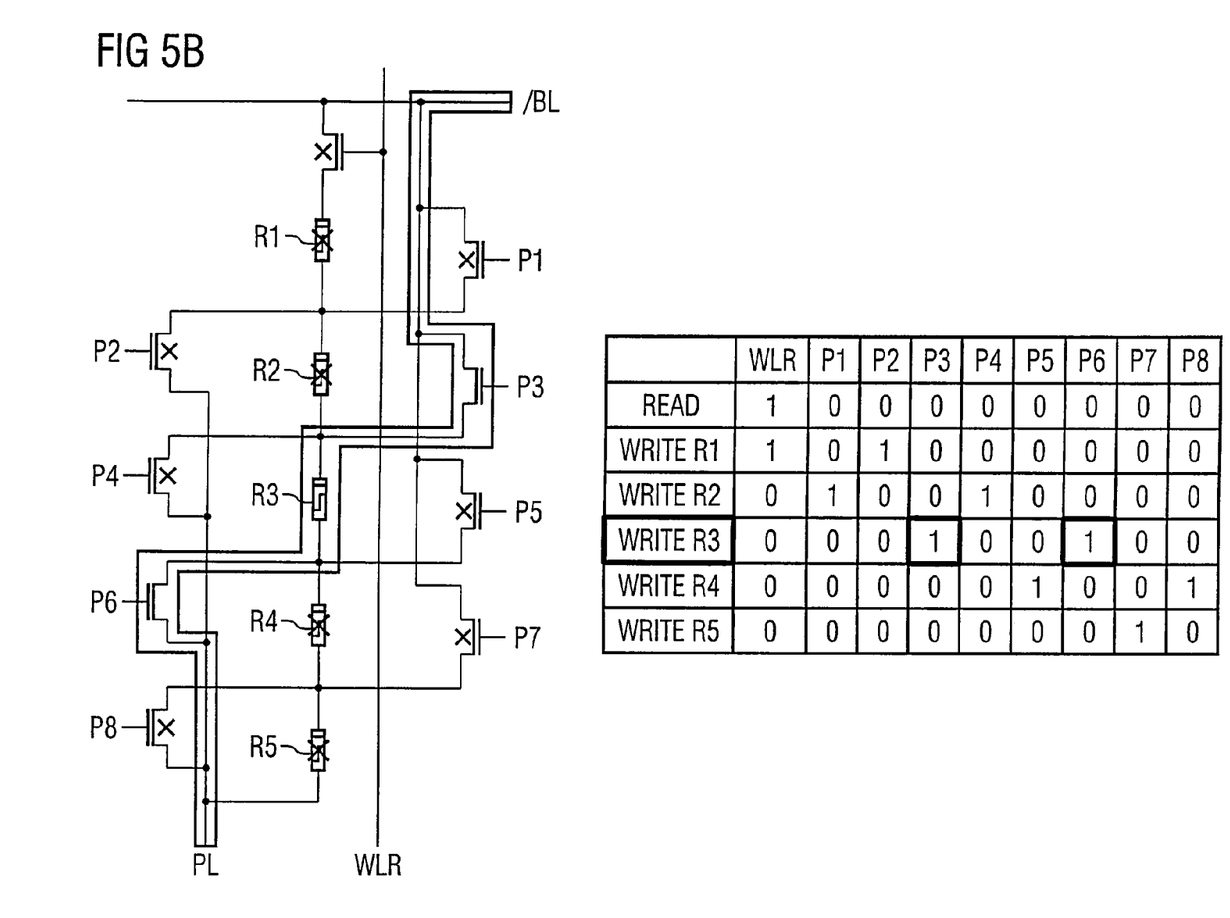
Figure 5C:
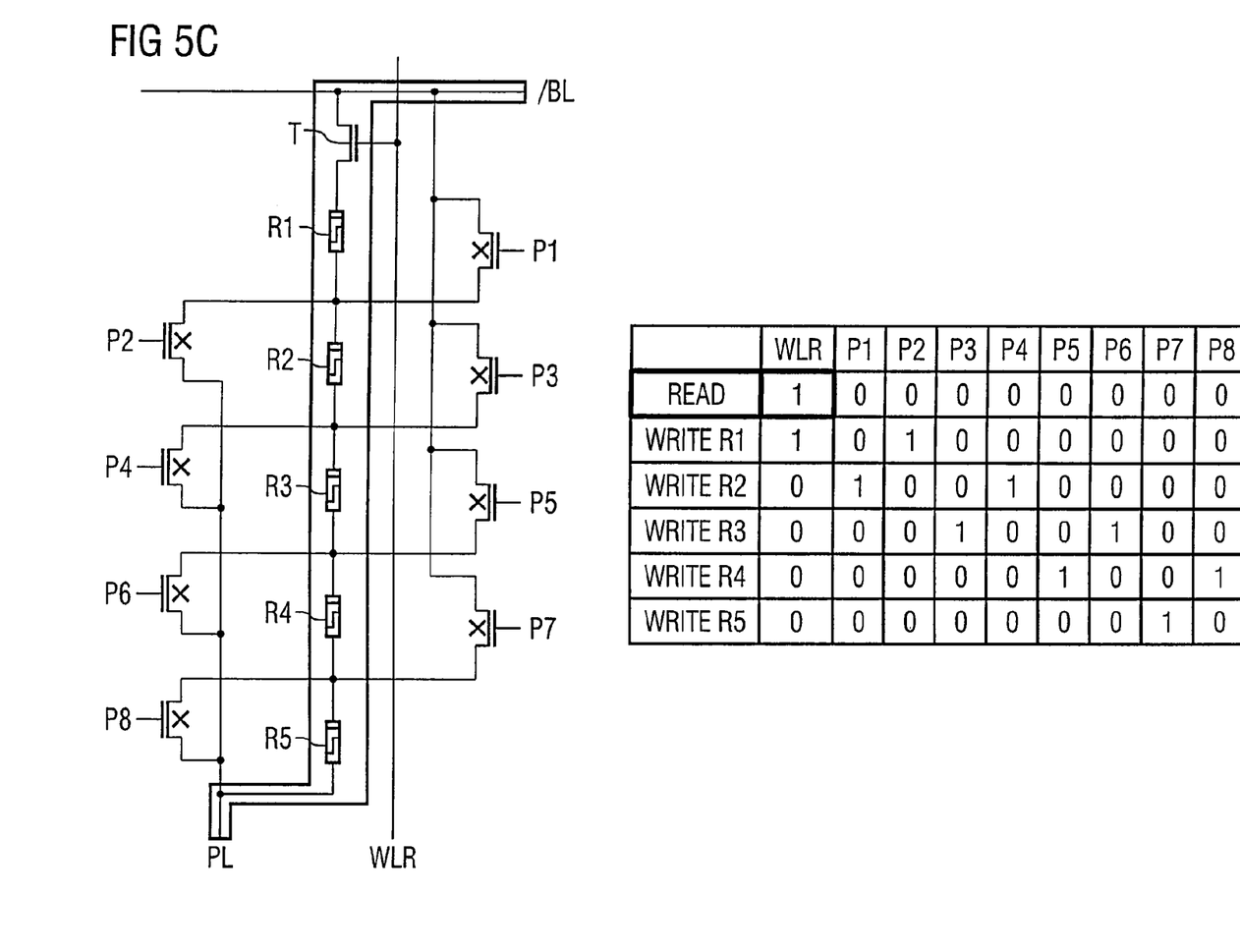

FIG. 5A furthermore shows the truth table with the control signals for the drive transistors of the programming circuit and the drive transistor T of the reference memory cell, which have to be activated for the switching of specific resistance memory elements and for the read-out of the reference memory cell. FIG. 5B shows the driving for writing to the resistance memory element R3, where X indicates the non-activated components of the programming circuit. The activated current path is furthermore illustrated in FIG. 5B. FIG. 5C shows the driving for the read-out of the reference memory cell.

The invention affords the possibility of providing an ideal reference voltage for the read-out of the memory cells in a simple manner in the case of a memory circuit comprising memory cells having resistance memory elements. This is achieved by virtue of the fact that the reference voltage is generated in accordance with the same principle as the reading of the memory cell itself, namely by charging or discharging a reference capacitor in parallel with the charging and discharging of a capacitor via the memory cell to be read. In this case, the reference resistor is preferably formed by a series circuit comprising a plurality of discrete memory cells, the reference resistor and thus the number of memory cells connected in series ideally being set to a voltage value between the state "0" and the state "1" of the memory cell.

While the foregoing is directed to embodiments of the present invention, other and further embodiments of the invention may be devised without departing from the basic scope thereof, and the scope thereof is determined by the claims that follow.

What is claimed is:

1. A memory circuit, comprising:
   a memory cell having a resistance memory element that can be switched between a high-resistance state and a low-resistance state by means of electrical pulses and being connected between a ground terminal and a capacitor;
   an evaluation device configured to assess the difference between the electrical potentials of the capacitor and a reference capacitor; and
   a reference memory cell with a reference resistor and connected between the ground terminal and the reference capacitor; the memory cell and the reference memory cell being switched on during the reading operation in order to charge the capacitor and the reference capacitor to a read voltage or in order to discharge the capacitor and the reference capacitor which have been precharged to the read voltage, and the evaluation device assessing the difference between the electrical potentials of the capacitor and the reference capacitor at a predetermined instant after the switching-on of the memory cell and the reference memory cell, wherein the reference resistor meets the following condition:

$$R_{REF} = R_{ON} \cdot \frac{\ln F}{\ln(F+1) - \ln 2} \text{ where } F = \exp\left(-\frac{t}{R_{ON} \cdot C_{BL}}\right)$$

$C_{BL}$ being one of the capacitance and the reference capacitance, $R_{ON}$ being the resistance of the memory cell in the low-resistance state, and t being the evaluation instant.

2. The memory circuit as claimed in claim 1, wherein the memory cells each have a selection transistor, which is arranged in series with the resistance memory element and is switched via an associated word line.

3. The memory circuit as claimed in claim 1, wherein the reference resistor is formed from a series circuit of resistance memory elements.

4. The memory circuit as claimed in claim 3, further comprising:
   a programming circuit in order to activate the resistance memory elements that form the reference resistor.

5. The memory circuit as claimed in claim 1, wherein the capacitor and the reference capacitor are formed by a line pair comprising a bit line and a complementary bit line.

6. The memory circuit as claimed in claim 5, further comprising:
   a multiplicity of memory cells each having a respective reference resistor and each connected to the bit line and to the complementary bit line in parallel, wherein when a memory cell of the multiplicity of memory cells is connected to the bit line is switched on, the reference resistor on the complementary bit line is simultaneously switched on, and when a memory cell of the multiplicity of memory cells connected to the complementary bit line is switched on, the reference resistor on the bit line is simultaneously switched on.

7. A memory circuit comprising:
   a memory cell having a resistance memory element that can be switched between a high-resistance state and a low-resistance state by means of electrical pulses and being connected between a ground terminal and a capacitor;
   an evaluation device configured to assess the difference between the electrical potentials of the capacitor and a reference capacitor;
   a reference memory cell with a reference resistor and connected between the ground terminal and the reference capacitor; the memory cell and the reference memory cell being switched on during the reading operation in order to charge the capacitor and the reference capacitor to a read voltage or in order to discharge the capacitor and the reference capacitor which have been precharged to the read voltage, and the evaluation device assessing the difference between the electrical potentials of the capacitor and the reference capacitor at a predetermined instant after the switching-on of the memory cell and the reference memory cell, the reference resistor of the reference memory cell being formed from a series circuit including at least two resistance memory elements; and
   a selection transistor of the reference memory cell connected upstream of the series circuit of at least two resistance memory elements that forms the reference resistor, wherein a selection transistor of the memory cell is connected upstream of the resistance memory element of the memory cell, a channel length of the selection transistor of the reference memory cell corresponding to a channel length of the selection transistors of the memory cells multiplied by the number of resistance memory elements of the reference memory cell connected in series.

8. The memory circuit as claimed in claim 7, further comprising:
   a programming circuit in order to activate the resistance memory elements that form the reference resistor.

9. The memory circuit as claimed in claim 8, wherein the reference resistor meets the following condition:

$$R_{REF} = R_{ON} \cdot \frac{\ln F}{\ln(F+1) - \ln 2} \text{ where } F = \exp\left(-\frac{t}{R_{ON} \cdot C_{BL}}\right)$$

$C_{BL}$ being one of the capacitance and the reference capacitance, $R_{ON}$ being the resistance of the memory cell in the low-resistance state, and t being the evaluation instant.

10. The memory circuit as claimed in claim 7, wherein the reference resistor meets the following condition:

$$R_{REF} = R_{ON} \cdot \frac{\ln F}{\ln(F+1) - \ln 2} \text{ where } F = \exp\left(-\frac{t}{R_{ON} \cdot C_{BL}}\right)$$

$C_{BL}$ being one of the capacitance and the reference capacitance, $R_{ON}$ being the resistance of the memory cell in the low-resistance state, and t being the evaluation instant.

11. A memory circuit, comprising:
   a memory cell having a resistance memory element that can be switched between a high-resistance state and a low-resistance state by means of electrical pulses and being connected between a ground terminal and a capacitor;

an evaluation device configured to assess the difference between the electrical potentials of the capacitor and a reference capacitor; and a reference memory cell with a reference resistor and connected between the ground terminal and the reference capacitor, the memory cell and the reference memory cell being switched on during the reading operation in order to charge the capacitor and the reference capacitor to a read voltage or in order to discharge the capacitor and the reference capacitor which have been precharged to the read voltage, and the evaluation device assessing the difference between the electrical potentials of the capacitor and the reference capacitor at a predetermined instant after the switching-on of the memory cell and the reference memory cell;

the reference resistor of the reference memory cell being configured such that, at the predetermined instant, a reference voltage of the reference memory circuit lies between a voltage of the memory cell corresponding to the low-resistance state and a voltage of the memory cell corresponding to the high-resistance state;

wherein the reference resistor of the reference memory cell meets the following condition;

$$R_{REF} = R_{ON} \cdot \frac{\ln F}{\ln(F+1) - \ln 2} \text{ where } F = \exp\left(-\frac{t}{R_{ON} \cdot C_{BL}}\right)$$

$C_{BL}$ being one of the capacitance and the reference capacitance, $R_{ON}$ being the resistance of the memory cell in the low-resistance state, and t being the evaluation instant.

* * * * *